(12) United States Patent
Wyant et al.

(10) Patent No.: US 6,907,363 B1
(45) Date of Patent: Jun. 14, 2005

(54) AUTOMATIC INSULATION RESISTANCE TESTING APPARATUS

(75) Inventors: Francis J. Wyant, Albuquerque, NM (US); Steven P. Nowlen, Albuquerque, NM (US); Spencer M. Luker, Cedar Crest, NM (US)

(73) Assignee: Sandia Corporation, Albuquerque, NM (US)

( * ) Notice: Subject to any disclaimer, the term of this patent is extended or adjusted under 35 U.S.C. 154(b) by 196 days.

(21) Appl. No.: 10/271,371

(22) Filed: Oct. 15, 2002

Related U.S. Application Data

(60) Provisional application No. 60/329,288, filed on Oct. 15, 2001.

(51) Int. Cl.$^7$ ............................................. G01R 27/26
(52) U.S. Cl. ............................. 702/65; 702/59; 702/62; 702/122
(58) Field of Search .............................. 702/59, 62, 65, 702/122; 324/539, 540, 541, 542, 544, 549, 551, 555, 557, 556; 340/853.7, 853.1, 854.9, 854.7, 855.3; 174/341, 117 F, 117 FF, 121 A, 110 R, 113 R, 115

(56) References Cited

U.S. PATENT DOCUMENTS

| | | | |
|---|---|---|---|
| 4,056,771 A | | 11/1977 | Clinton et al. |
| 4,144,487 A | * | 3/1979 | Pharney ..................... 324/522 |
| 4,151,461 A | | 4/1979 | Pontre |
| 4,155,441 A | | 5/1979 | Albrecht et al. |
| 4,160,947 A | | 7/1979 | Tanno et al. |
| 4,313,085 A | | 1/1982 | Balchunas |
| 4,336,494 A | | 6/1982 | Shindo et al. |
| 4,517,510 A | | 5/1985 | Clinton |
| 4,868,507 A | * | 9/1989 | Reed .......................... 324/525 |
| 4,931,721 A | * | 6/1990 | Berrigan et al. ............ 324/658 |
| 4,980,645 A | | 12/1990 | Soma et al. |
| 5,155,441 A | | 10/1992 | Zelm |
| 5,181,026 A | * | 1/1993 | Granville ............... 340/870.28 |
| 5,220,285 A | | 6/1993 | Cerda |
| 5,243,243 A | * | 9/1993 | Andrews ...................... 310/72 |
| 5,276,401 A | | 1/1994 | Soma et al. |
| 5,448,176 A | | 9/1995 | Mashikian et al. |
| 5,469,066 A | | 11/1995 | Ito et al. |
| 5,606,592 A | * | 2/1997 | Galloway et al. ............. 379/30 |
| 5,617,033 A | | 4/1997 | Kashioka et al. |
| 6,147,309 A | * | 11/2000 | Mottine et al. ........ 174/110 PM |
| 6,225,811 B1 | | 5/2001 | Bruning et al. |
| 6,469,636 B1 | * | 10/2002 | Baird et al. .............. 340/854.9 |
| 2003/0085816 A1 | * | 5/2003 | Baird et al. .............. 340/854.9 |

OTHER PUBLICATIONS

United States Air Force; Military Specification: Wiring Harness, Space Vehicle, Design and Testing, General Specification For; Mar. 1, 1973.

* cited by examiner

*Primary Examiner*—Carol S W. Tsai
(74) *Attorney, Agent, or Firm*—Robert D. Watson

(57) ABSTRACT

An apparatus and method for automatic measurement of insulation resistances of a multi-conductor cable. In one embodiment of the invention, the apparatus comprises a power supply source, an input measuring means, an output measuring means, a plurality of input relay controlled contacts, a plurality of output relay controlled contacts, a relay controller and a computer. In another embodiment of the invention the apparatus comprises a power supply source, an input measuring means, an output measuring means, an input switching unit, an output switching unit and a control unit/data logger. Embodiments of the apparatus of the invention may also incorporate cable fire testing means. The apparatus and methods of the present invention use either voltage or current for input and output measured variables.

24 Claims, 13 Drawing Sheets

AUTOMATIC INSULATION RESISTANCE TESTING APPARATUS

CROSS REFERENCE TO OTHER PATENT APPLICATIONS

This application claims priority under 35 USC 119 to U.S. provisional patent Ser. No. 60/329,288, filed Oct. 15, 2001.

STATEMENT REGARDING FEDERALLY SPONSORED RESEARCH OR DEVELOPMENT

The present invention was made under Contract DE-AC04-94AL85000 with the United States Department of Energy. The Government may have certain rights in the invention.

BACKGROUND OF THE INVENTION

This invention relates to a method and apparatus for electrically testing cables comprising a plurality of insulated conductors in an automated fashion. The effective electrical isolation between individual conductors in a cable as well as between individual conductors and ground are measured. The invention also provides for cable failure mode analysis during flame testing of a multi-conductor cable.

FIG. 1 illustrates a sampling of the various types of cables comprising multiple insulated conductors. Although the conductor cores are illustrated as solid, often each conductor core future comprises individual small diameter conductors in physical contact with the other conductors of a core. Such conductor cores are identified as "stranded" in the art. Stranded conductor cores typically contain 7 or more individual conductors or strands. The method and apparatus of the present invention is suitable for cables having insulated solid conductor cores as well as cables having insulated stranded conductor cores.

Insulation resistance is used as the preferred measure of electrical isolation. As a unique signature voltage is impressed on each conductor in a cable (or cable bundle) then by systematically allowing for and monitoring known current leakage paths it is possible to determine if leakage from one conductor to another, or to ground, is occurring. Part or the entire voltage signature may be detected on any of the other conductors in the cable (or in an adjacent cable) or may leak to ground directly.

Application of this principle is illustrated with a three-conductor (3/C) cable in FIG. 2. If 100 volts is applied to conductor 1, then the degree of isolation of conductors 2 and 3 from conductor 1 can be determined by systematically opening a potential conductor-to-conductor current leakage path and then reading the voltages of each conductor in turn while conductor 1 is energized. Determining the insulation resistance between conductors 1 and 2 at the time of voltage measurement on conductor 2 is a simple calculation employing Ohm's law:

$$I_{1-2} = \frac{V_2}{R} \quad (1)$$

And $$R_{1-2} = \frac{V_1}{I_{1-2}} - R \quad (2)$$

In FIG. 2A, three conductors 1, 2 and 3 are illustrated. A known supply voltage $V_1$ is being applied to conductor 1. Leakage current $I_{1-2}$ is detected by measuring the voltage $V_2$ across known resistor R. Insulation resistance $R_{1-2}$ is a measure of the electrical isolation between conductor 1 and 2. Similarly, insulation resistance $R_{1-3}$ is between conductors 1 and 3. Insulation resistance $R_{2-3}$ is between conductors 2 and 3.

In the same way, the insulation resistance existing between conductors 1 and 3 at the time $V_2$ is measured can be determined. A time-dependent history of $R_{1-2}$ and $R_{1-3}$ can be obtained by continuously switching between the two conductors and recording the voltage drop across R at each switch position. (Of course an alternate method would be to connect a resistor/voltmeter assembly to both conductors 2 and 3 simultaneously and keep a continuous record of the two voltages. This approach quickly becomes unwieldy as the number of conductors increases.)

This method of measuring insulation resistance $R_{1-2}$ is not strictly correct as it ignores the alternate leakage path from conductor 1 to conductor 3 and then from conductor 3 to conductor 2. When the additional leakage path is considered, the above equations change to:

$$I_{1-2} + I_{1-3-2} = \frac{V_2}{R}$$

and $$R_{1-2} = \frac{V_1 - R*(I_{1-2} + I_{1-3-2})}{I_{1-2}}$$

With two equations and three unknown quantities ($R_{1-2}$, $I_{1-2}$, $I_{1-2-3}$) it is not possible to directly determine insulation resistance $R_{1-2}$. What must be added are additional measurements, with switch SW in the alternate position, as illustrated in FIG. 2B.

However, measuring voltages with switch SW in both positions does not describe the isolation existing between conductors 2 and 3 (because conductor 1 is always the energized conductor). However, by sequentially energizing each conductor and reading the impressed voltages on the remaining conductors one can determine the relative resistance existing between any conductor pair. An example circuit (see FIG. 3).

FIG. 3 schematic illustrates how a three conductor cable's insulation resistances are measured using two sets of controlled switches, one set on the input side (SWi) and one on the output side (SWj) of the circuit. One switch on the voltage input side is closed (thereby energizing one conductor) followed by the sequential closing-measurement-opening of each measurement side switch. Each sequential switching configuration measures leakage currents between one energized "source" conductor and one non-energized "target" conductor, and the various pairs are systematically evaluated in sequence.

The addition of a ground plane further complicates insulation resistance measurements. FIG. 4 illustrates additional insulation resistance $R_{1-G}$, $R_{2-G}$ and $R_{3-G}$ between each respective conductor and the ground plane. The schematic of FIG. 3 is not able to determine the resistances $R_{1-G}$, $R_{2-G}$ and $R_{3-G}$. It is seen then that a measuring method and apparatus are needed to conveniently measure all of the insulation resistance's in a multi-conductor cable in the presence of a ground plane Another aspect of the present invention is providing a convenient means of testing cable failures during fire exposure and to qualify cables for use in high-reliability applications. For example, The U.S. Nuclear Regulatory Commission (USNRC) continues to focus considerable attention on the issue of fire-induced cable failures and the associated circuit faults induced by such failure. Of particular interest is the potential that fire-induced failure of a control cable might lead to the spurious operation of plant equipment. This issue is of interest both in the regulatory process and with regard to fire probabilistic risk assessment (PRA) methods and data.

In the context of quantifying the impact of cable failure modes and effects on fire risk analysis, one quantity that needs to be estimated is the likelihood that spurious equipment operations may occur during a fire. The likelihood that a given circuit fault mode (e.g., spurious operation) will be observed is tied intimately to the likelihood of various cable failure modes (e.g., hot short, short to ground, open circuit) will occur as a result of fire-induced cable damage.

For example, given a control or power circuit with a grounded power source, spurious operation circuit faults would typically be observed only during a conductor-to-conductor hot short. Furthermore, the hot short would typically need to involve specific combinations of conductors. The specific conductor shorting configurations that might lead to spurious operation represent some subset of all of the possible conductor shorting combinations.

Other conductor shorting combinations or other modes of shorting might lead to other circuit fault modes. For example, shorting of an energized conductor to ground might cause the protective fuses to open, thus de-energizing the circuit. Hence, in order to systematically estimate the likelihood of a spurious operation circuit fault given cable failure it is necessary to (1) identify the various conductor failure modes and their associated effects on the circuit, and (2) assess the relative likelihood that the cable failure modes that lead to spurious operation circuit faults might actually occur.

Measuring the insulation resistance values illustrated in FIG. 4 satisfies the need to systematically estimate circuit faults provided the measurements can be made during a failure event. A cable to be tested is connected to test terminals inside an environmental flame test chamber. Insulation resistance measurements are taken repeatedly until cable faults are identified. The time to fault as well as the type of fault is then used to qualify a cable for use in high-reliability service.

Simulation of real-world failures is closest represented by using circuit energization equal to voltages encountered in actual use circuits. For example 4–20 ma control circuits are typically energized with a 24 V DC power source. When placed in cable tray, they may be adjacent to motor control cables operating at 120 V AC. For this case, real-world simulation will use the higher 120 V level to estimate all circuit failures, or the lower 24 V power source to estimate circuit failures is, isolated 4–20 ma cable wiring.

In either scenario, an enormous amount of labor must be expended in taking and recording the numerous readings during the course of cable fire exposure. For safety, personnel must also be isolated from the hazards of the fire exposure test, including heat, smoke and toxic vapors. The three conductor cable of FIG. 4 has six insulation resistances to be determined throughout a flame test. Table 1 shows that as the number of conductors increases, the number of measurements increases geometrically. In the case of a ten conductor cable, 55 insulation resistances need to be determined. This increases to 136 for a sixteen conductor cable, 300 for a 24 conductor cable and 528 for a 32 conductor cable.

TABLE 1

Number of Insulation Resistances in Multi-conductor Cable

| Number of Conductors | No. of Insulation Resistances, Conductor to Ground | No. of Insulation Resistances, Conductor to Conductor | Total Number of Insulation Resistance Measurements |
| --- | --- | --- | --- |
| 2 | 2 | 1 | 3 |
| 3 | 3 | 3 | 6 |
| 4 | 4 | 6 | 10 |
| 5 | 5 | 10 | 15 |
| 6 | 6 | 15 | 21 |
| 7 | 7 | 21 | 28 |
| 8 | 8 | 28 | 36 |
| 9 | 9 | 36 | 45 |
| 10 | 10 | 45 | 55 |
| 12 | 12 | 66 | 78 |
| 16 | 16 | 120 | 136 |
| 20 | 20 | 190 | 210 |
| 24 | 24 | 276 | 300 |
| 28 | 28 | 378 | 406 |
| 32 | 32 | 496 | 528 |

During environmental chamber testing, personnel hazards of heat (thermal burns) and toxic fumes and gases are generated. Toxic fumes and gases originate with the flame as will as cable insulation combustion and partial combustion products. Steps taken to minimize personnel exposure are limited when measurements are being directly identified and recorded by personnel. In order to allow total separation of the environmental testing from personnel a fully automatic resistance measuring apparatus is required.

As a result it, there is a need in the art for an apparatus and method that measures multi-conductor cable insulation resistances automatically while protecting personnel from hazards of environmental testing and is useful with multi-conductor cables comprising more than 3 conductors.

BRIEF SUMMARY OF THE INVENTION

An apparatus and method for automatic measurement of insulation resistances of a multi-conductor cable. In one embodiment of the invention, the apparatus comprises a power supply source, an input measuring means, an output measuring means, a plurality of input relay controlled contacts, a plurality of output relay controlled contacts, a relay controller and a computer. In another embodiment of the invention the apparatus comprises a power supply source, an input measuring means, an output measuring means, an input switching unit, an output switching unit and a control unit/data logger. Embodiments of the apparatus of the invention may also incorporate cable fire testing means.

The present invention additionally comprises methods for automatic measurement of insulation resistances of a multi-conductor cable. The steps of the method of the present invention include connecting a multiconductor cable to a power source, automatically connecting an input voltage of higher value to one conductor of the multi-conductor cable, automatically connecting an output voltage of lower value, in turn to each remaining conductor of the multi-conductor cable, automatically measuring and recording an input measured variable and an output measured variable for each combination of automatic connecting to an input voltage and connecting to an output voltage, and determining multi-conductor insulation resistances from the recorded values of input measured variable and output measured variable. The method of the present invention further may include the steps of exposing the multi-conductor cable to a fire test.

The apparatus and methods of the present invention use either voltage or current for input and output measured variables.

DETAILED DESCRIPTION OF THE INVENTION

The present invention is directed toward automatic measurement method and apparatus for measuring insulation resistance of a multi-conductor cable, suitable for use for fault determination during flame tests.

Figure 5:
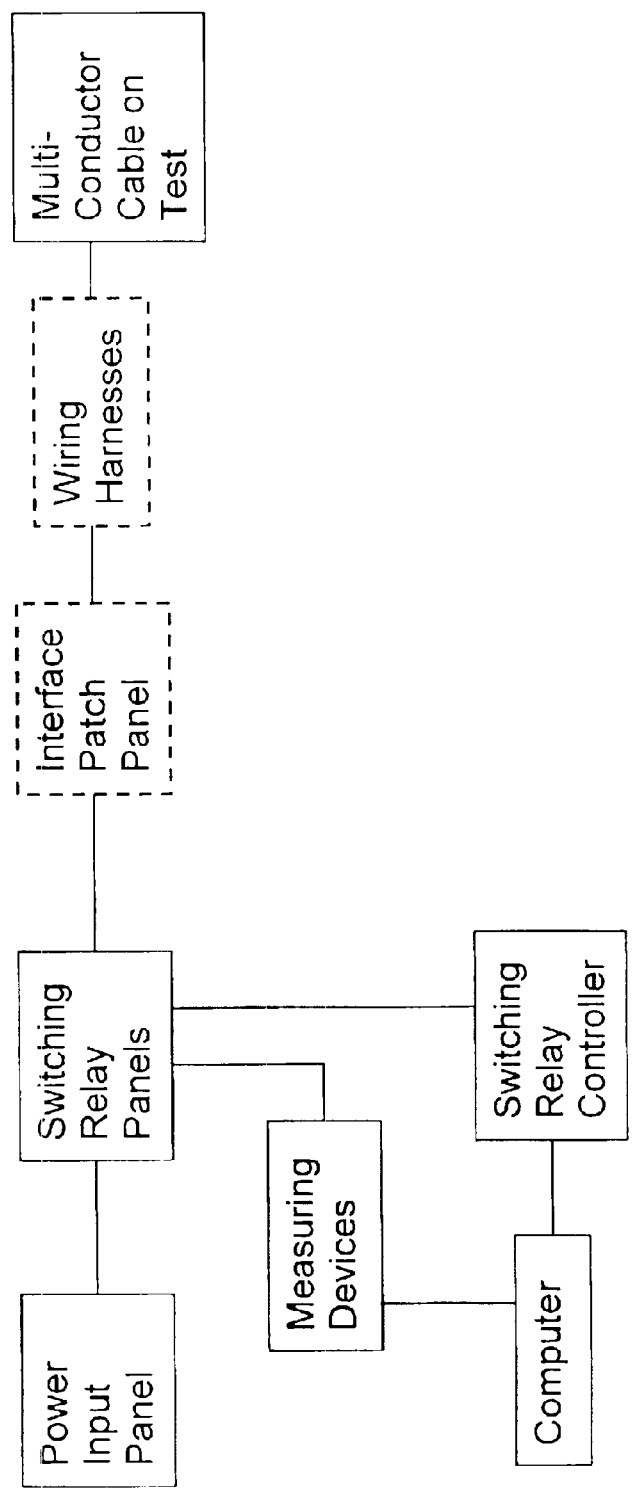
FIG. 5 illustrates major components of the apparatus of the present invention.

FIG. 5 illustrates major components of the present invention. The present invention is used to test Multi-conductor Cable on Test and comprises a power source (Power Input Panel), Measuring Devices, Computer, Switching Relay Controller, Switching Relay Panels. For convenience in making electrical connections to the Multi-conductor Cable on Test, an Interface Patch Panel and Wiring Harness may optionally be incorporated.

Figure 6A:
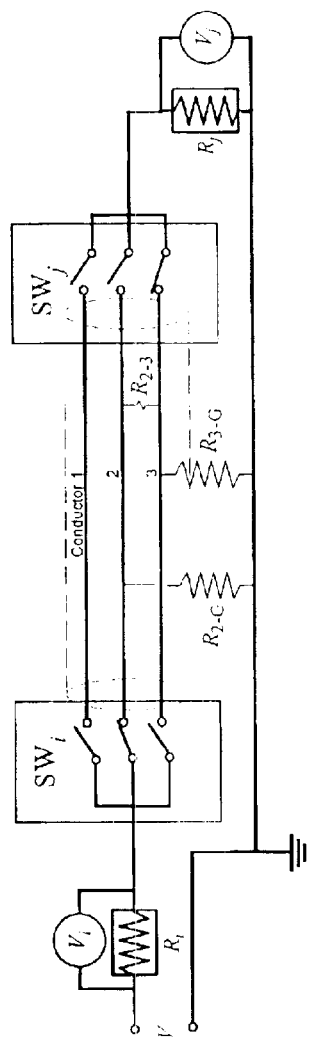
FIG. 6A illustrates an embodiment of the present invention for testing a 3 conductor cable, upstream switch $SW_i$ in position 2, downstream switch SW in position 3.
Figure 6B:
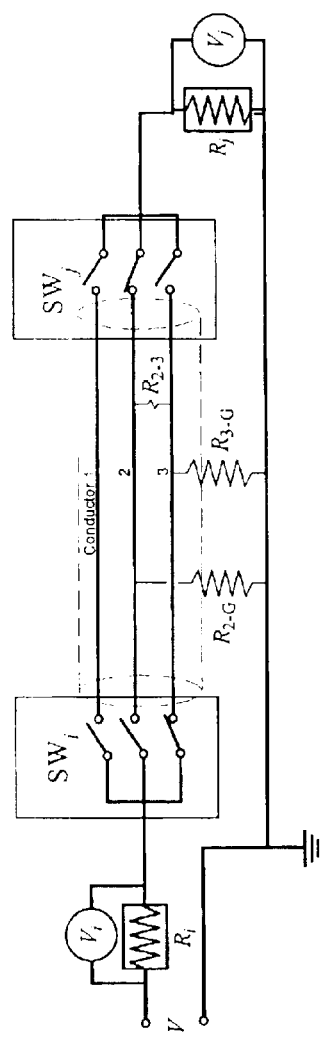
FIG. 6B illustrates an embodiment of the present invention for testing a 3 conductor cable, upstream switch $SW_i$ in position 3, downstream switch SW in position 2.
Figure 7:
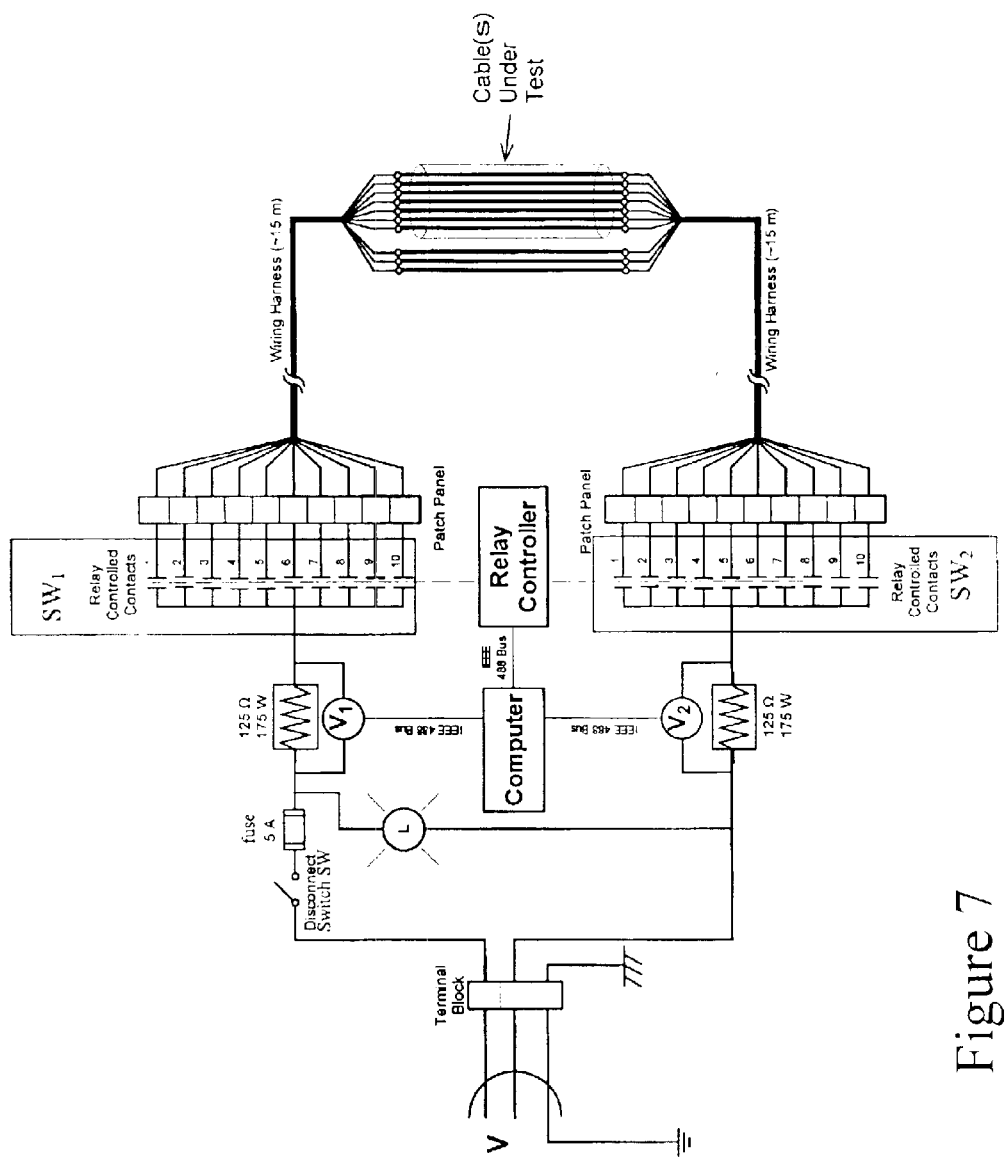
FIG. 7 illustrates an embodiment of the present invention for testing a 10 conductor cable.

FIG. 6A and FIG. 6B illustrate schematics for an embodiment for automatic testing of 3 conductor cables using voltage measurement. FIG. 6A and FIG. 6B are further described below to illustrate how insulation resistance is determined from pairs of voltage measurements. FIG. 7 illustrates an embodiment of the present invention suitable for automatic testing of 10 conductor cables using voltage measurement. By comparing FIG. 7 to FIG. 6A and FIG. 6B, one skilled in the art is able to extend the invention to automatic testing apparatus and method for cables of any number of conductors.

Figure 9:
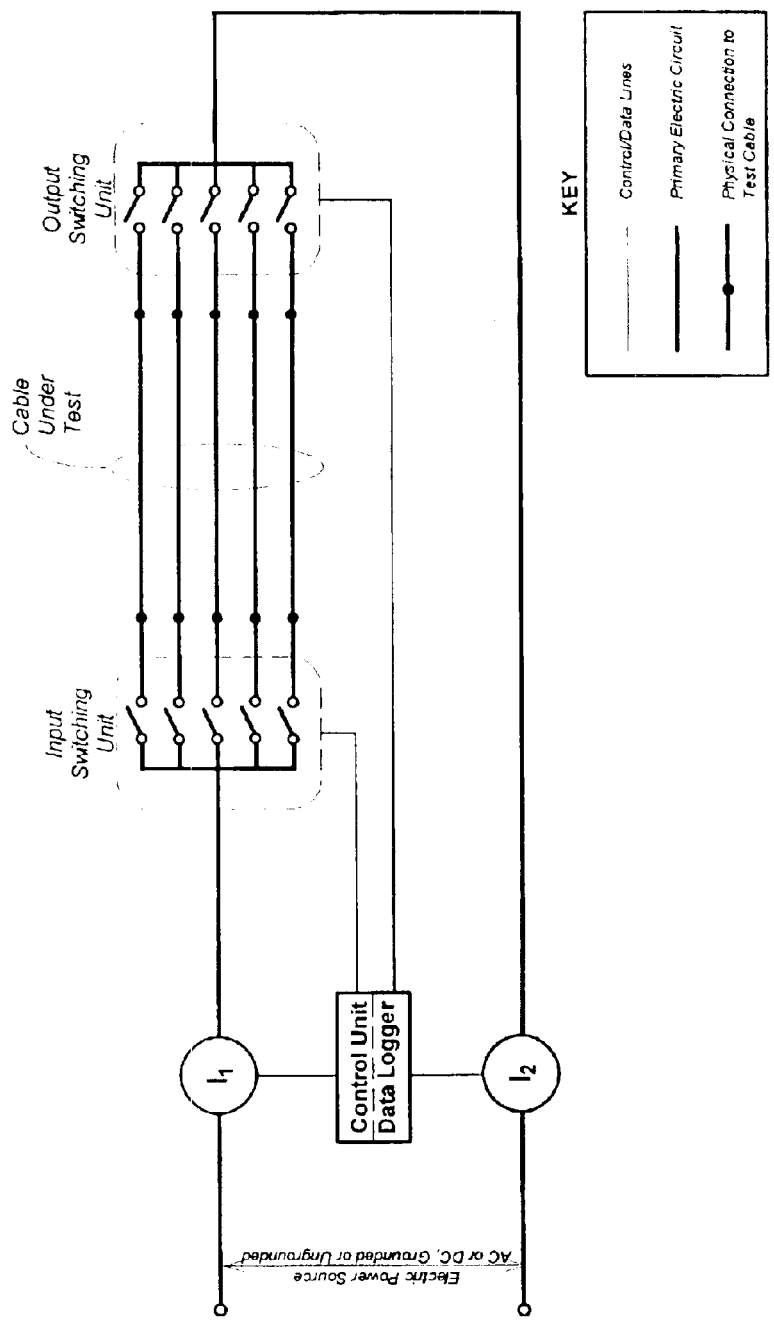
FIG. 9 illustrates an embodiment of the present invention using current measurement in place of voltage measurement.
Figure 10:
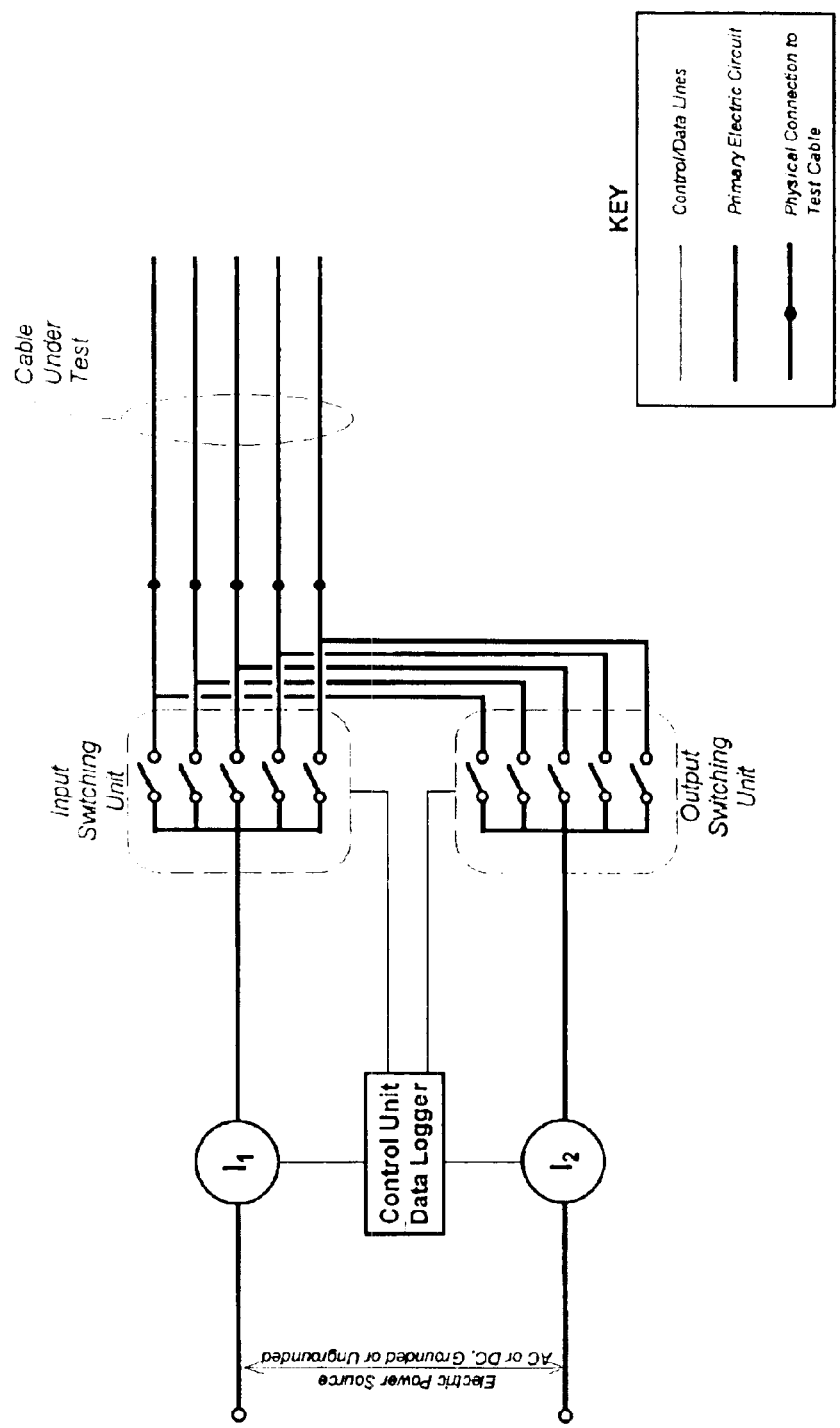
FIG. 10 illustrates an embodiment of the present invention using current measurement in place of voltage measurement.

FIG. 10 and FIG. 9 illustrate embodiments of the invention comprising current measuring means in place of voltage measuring means.

Figure 8:
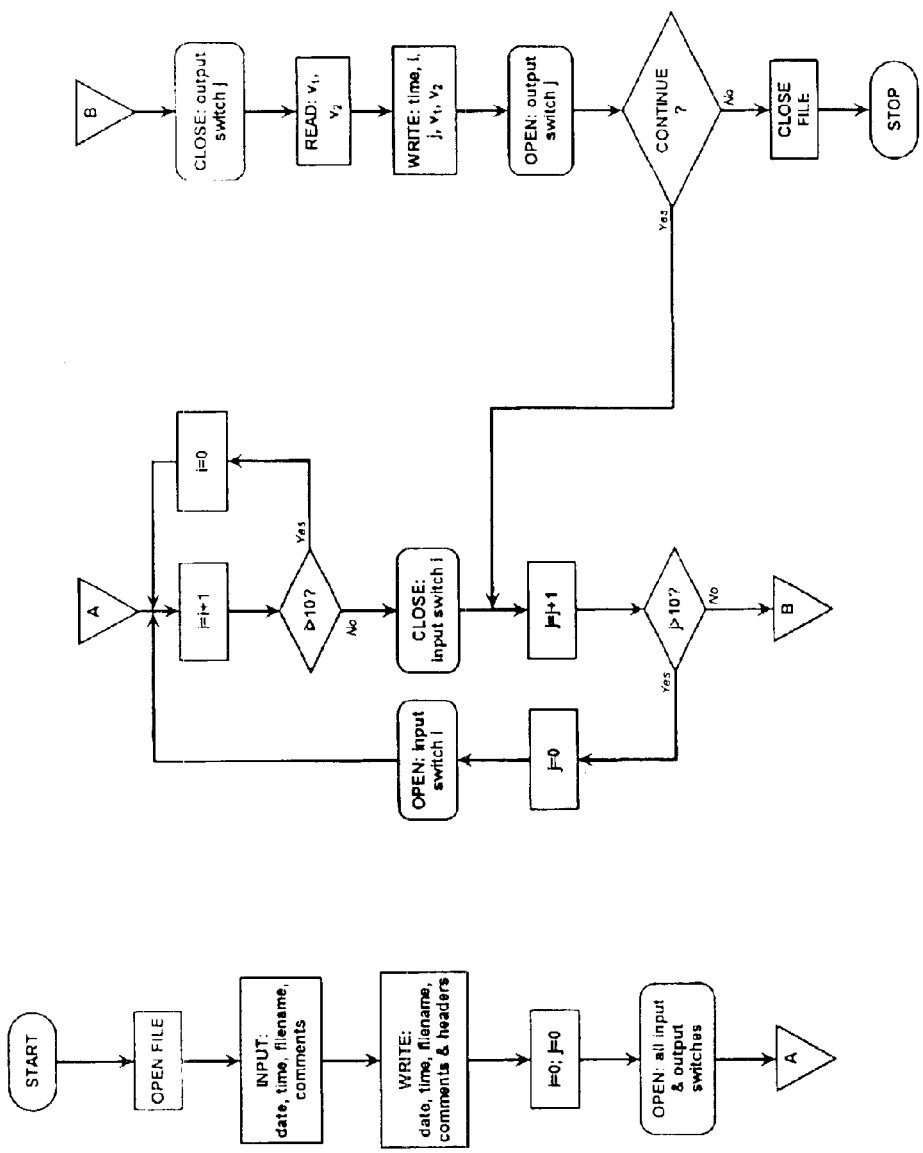
FIG. 8 illustrates an example flow chart of the computer instructions used by certain embodiments of the present invention.

FIG. 8 is one example of a flowsheet illustrating the computer instructions used to perform the automatic step sequence of the present invention.

Figure 4:
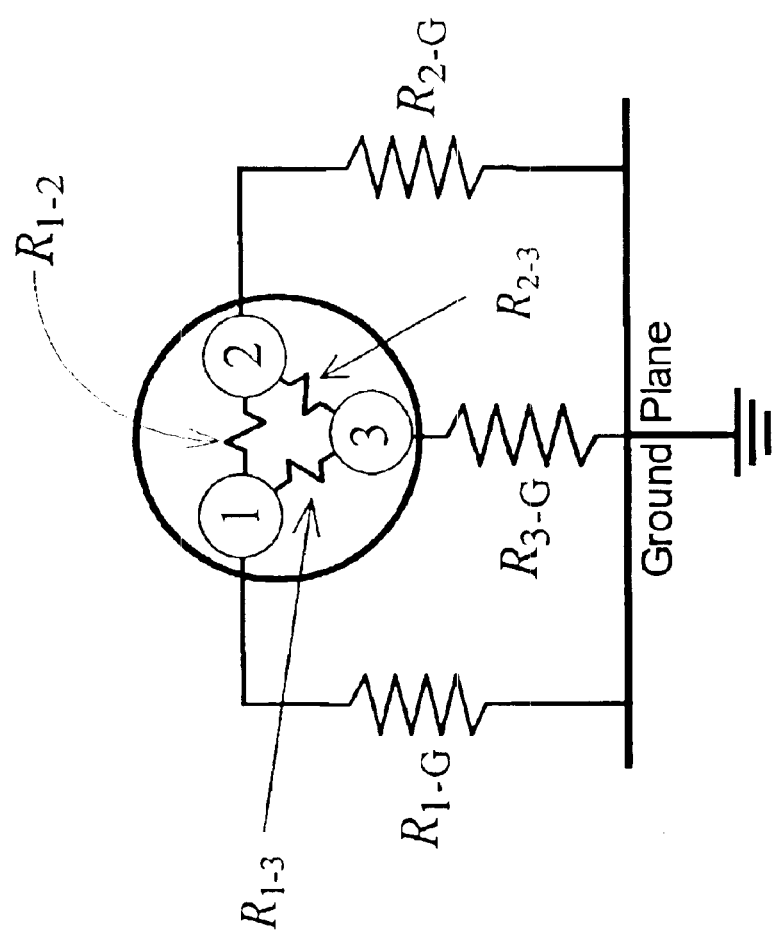
FIG. 4 illustrates the 6 insulation resistances for a 3 conductor cable.

FIG. 6A and FIG. 6B illustrate an embodiment of the present invention capable of measuring the six insulation resistances of FIG. 4. A ballast/load resistor $R_i$ is incorporated on the input side as well as the output side $R_j$. Measuring voltage across the ballast resistors yields current flows as well as providing a measure of voltage. FIG. 6A and FIG. 6B illustrate how three of the six insulation resistances (i.e. $R_{2-3}$, $R_{2-G}$, $R_{3-G}$) are determined from two sets of voltage measurements. Other insulation resistances are omitted for clarity (e.g. $R_{1-2}$, $R_{1-3}$, $R_{1-G}$).

The present invention makes use of "measured pairs" to advantageously provide scalability and reduced numbers of measuring means. By using measured pairs, the embodiment of FIG. 7, suitable for 10 conductor cable, comprises the same number of measuring means as the embodiment of FIG. 6A and FIG. 6B, suitable for 3 conductor cables. As is demonstrated, an embodiment to test a cable of any number of conductors is possible using measured pairs and 2 measuring means. As a Cable on Test has increasing number of conductors, simply more controlled relay contacts are added. Other changes to accommodate the greater number of conductors, is limited to minor program changes in Relay Controller and Computer program.

In the embodiment of the present invention illustrated in FIG. 6A and FIG. 6B, a Multi-Conductor Cable on Test is depicted with the three conductors Conductor 1, Conductor 2 and Conductor 3. Power Input originates with input voltage V that may be referenced to ground, but may also be electrically isolated from ground. A measuring means is provided to measure voltage $V_i$ across input ballast resistor $R_i$. Similarly, a measuring means is provided to measure voltage $V_j$ across input ballast resistor $R_j$. An input Switching Relay Panel $SW_i$ and an outlet Switching Relay Panel $SW_j$ are provided. Three of the six insulation resistances are depicted as $R_{2-3}$, $R_{2-G}$, $R_{3-G}$. Optional Interface Patch Panel and Wiring Harness are not depicted.

Measurements $V_i$ and $V_j$ are taken and automatically recorded with corresponding position of contacts of $SW_i$, and $SW_j$. The present invention imparts great labor savings and shorter testing durations by taking and recording $V_i$ and $V_j$ automatically. The measuring means $V_i$ and $V_j$ are connected to a computer that provides data storage as well as controlling the position of contacts of $SW_i$ and $SW_j$.

It is estimate that to manually set the positions of the contacts and then manually read and record two measurements requires 10–20 seconds. In contrast, the present invention is capable of setting contact positions, reading and recording two measurements in 0.2–2.0 seconds. Even faster times are possible with the present invention and limited only by transient voltage times and the test cable capacitance. For most instances, a measuring and recording time of 0.5 seconds is suitable.

FIG. 6A and FIG. 6B further illustrate the use of measured pairs of data to calculate three resistances for each conductor pair. One conductor-to-conductor path and each of the two conductor-to-ground paths are calculated from the measured voltages ($V_i$ and $V_j$) for two complementary switching configurations. Nomenclature for the measured variables and contact positions reflect the respective position of the relay switch panel. In FIG. 6A, input switch panel $SW_i$, is connected to Conductor 2. The corresponding input measurement is designated as $V_{i2}$.

Similarly, output switch panel $SW_j$ is connected to Conductor 3. The corresponding output measurement is designated as $V_{j3}$.

Turning to FIG. 6B, input switch panel $SW_i$ is connected to Conductor 3. The corresponding input measurement is designated as $V_{i3}$. Similarly, output switch panel $SW_j$, is connected to Conductor 2. The corresponding output measurement is designated as $V_{j2}$.

FIG. 6A and FIG. 6B therefore represent measured pairs as the selected input and output conductors are complements. The measured pair of FIG. 6A and FIG. 6B provide four separate measurement readings $V_{i2}$, $V_{i2}$, $V_{i2}$, $V_{i2}$ that are used along with V to determine the three resistance paths affecting these two conductors $R_{2-3}$, $R_{2-G}$, and $R_{3-G}$.

The equations for determining the three resistances for this case are as follows:

$$R_{2-G} = \frac{\lfloor V_{j2}V_{j3} - (V - V_{i2})(V - V_{i3}) \rfloor}{\left[\left(\frac{V_{i3}}{R_j} - \frac{V_{j2}}{R_j}\right)V_{j3} - \left(\frac{V_{i2}}{R_i} - \frac{V_{j3}}{R_j}\right)(V - V_{i3})\right]}$$

$$R_{3-G} = \frac{V_{j3}}{\left[\left(\frac{V_{i2}}{R_i} - \frac{V_{j3}}{R_j}\right) - \frac{(V - V_{i2})}{R_{2-G}}\right]}$$

$$R_{2-3} = \frac{\lfloor (V - V_{i2}) - V_{j3} \rfloor}{\left[\left(\frac{V_{j3}}{R_{3-G}}\right) + \left(\frac{V_{j3}}{R_j}\right)\right]}$$

The use of measured pairs is scalable for virtually any number of conductors in a cable or bundle of cables. FIG. 7 illustrates an embodiment of the present invention using measured pairs that is suitable for automatic testing of 10 conductor cables. The apparatus of FIG. 7 illustrates the use of optional Patch Panel and Wiring Harness. Each end of the Cable(s) Under Test is connected to a Wiring Harness. Each Wiring Harness, in turn is connected to a Patch Panel.

The Patch Panel's provide a demarcation point for making electrical connections to the relay controlled contacts. A common lead electrically connects input measuring means $V_1$ to the one side of all relay controlled contacts $SW_1$. The opposite side of each contact is electrically connected via the Patch Panel and Wiring Harness to an individual conductor of the Cable(s) Under Test. Similarly, a common lead electrically connects output measuring means $V_2$ to the one side of all relay controlled contacts $SW_2$. The opposite side of each contact is electrically connected via the Patch Panel and Wiring Harness to an individual conductor of the Cable(s) Under Test.

The Relay Controller controls the closing of input relay controlled contacts $SW_1$, as well as those of output relay controlled contacts $SW_2$. The Relay Controller receives instructions from Computer via a digital communications connection (for example IEEE specification 488 communications bus).

FIG. 7 illustrates the Relay Controller, input relay controlled contacts $SW_1$, and output relay controlled contacts $SW_2$ as separate devices. However, both sets of relay controlled contacts may be combined into a single set. Further the Relay Controller can be combined with the relay controlled contacts into a single device.

For example, as is known in the art, programmable logic controllers (PLC) and distributed control systems (DCS) are devices that combine the functions of a relay controller with relay controlled contacts.

Computer further comprises digital communications connections to input measuring means $V_1$ and output measuring means $V_2$. Digital communications connections to measuring means $V_1$ and $V_2$ may be any convenient digital communications compatible with Computer and measuring means $V_1$ and $V_2$ (for example IEEE specification 488 communications bus). Computer carries out the necessary computer instructions to initiate setting of relay controlled contacts, reading measured variables and recording read values.

Measuring means $V_1$ and $V_2$ are illustrated in FIG. 6A, FIG. 6B and FIG. 7 as voltage measuring devices, measuring voltage across ballast resistors. Ballast resistors are labeled $R_i$ and $R_j$ in FIG. 6A and FIG. 6B. In contrast, in FIG. 7 the ballast resistors are identified by value (i.e. 125 ohms) and rating (i.e. 175 Watts). The use of a particular ballast resistor is not limiting upon the invention. Any resistor of known value may be utilized. Particularly preferred are resistors with high thermal stability, defined as the resistance value change per degree of temperature change.

As the accuracy of the resultant determinations for insulation resistance depend upon the accuracy of the measuring means, high accuracy measuring means are preferred. High accuracy voltage measuring means are known in the art and commercially available from manufacturers including Hewlett Packard. For example, Hewlett Packard Model HP34401A are digital multimeters with IEEE specification 488 communication interface modules suitable for use with the present invention as measuring means.

Power supply V may be any stable power supply. It is preferred power supply V provide a relatively constant voltage. When using the measured pairs of the present invention, the accuracy of the resultant values is dependent upon supply voltage being constant or known for each measurement of the measurement pairs. Either direct current (DC) or alternating current (AC) sources may be used. Particularly preferred is the use of a power supply source that equals or exceeds voltage levels normally present in the Cable Under Test.

In the case of testing a cable to meet a particular regulatory specification the power supply voltage can be selected to meet the specification. For example, US Department of Defense Specification DOD-W-83575A requires insulation resistance testing to be performed using a DC voltage of 500V or higher (paragraph 4.5.3 of specification DOD-W-83575A).

FIG. 7 also illustrates how the apparatus may be optionally equipped with power disconnect switch SW, fuse 5A, and energized status light L. These features are optional and add convenience to the apparatus but are not limiting and may be omitted without conflicting with the intent of to the invention. In place of fuse 5A, a circuit breaker or other overcurrent protecting disconnect may be employed.

The Computer of FIG. 6A, FIG. 6B and FIG. 7 may be any convenient computer, personal computer, minicomputer or mainframe computer compatible with measuring means (for example, $V_1$ and $V_2$) and Relay Controller. For example, personal computers using Microsoft Windows® operating systems are suitable for use in the invention embodiments of FIG. 6A, FIG. 6B and FIG. 7.

FIG. 8 illustrates a flowchart of computer program instructions (computer program) suitable for use with the invention embodiments of FIG. 6A, FIG. 6B and FIG. 7, to be followed by Computer. Prior to starting the computer program the Cable Under Test is connected to the apparatus, (for example via Wiring Harness and Patch Panel) and the power supply is established by closing disconnect switch SW.

The program begins by initiating a file into which measurements will be stored. Header information may optionally be entered and stored and include for example, date, time, filename, comments. As the tests progress, input counter i is incremented from 0 to the number of conductors. For each value of i, output counter j is incremented from 0 to the number of conductors. Data measurements are read and recorded after each incrementing of j. For example, a 10 conductor cable will record measured values for each 10 values of output counter j per each of 10 values of input counter i. This results in 100 measured sets values being recorded.

Some of the 100 value sets may be skipped, if desired. For example, when both the input and output contacts are connected to the same conductor, the resistance of the conductor and not its insulation resistance is measured. In the case of FIG. 8 the number of recorded data sets can be reduced by the number of conductors or 10.

The flowchart of FIG. 8 illustrates a single cycle of the invention. In order to progress through a fixed number of cycles, continue decision box is changed to a cycle counter. The program is set to terminate as the cycle counter reaches an entered value or an operator manually enters a do not continue command. In order to have the program continuously cycle, a second continue decision box is added so that unless operator intervention occurs, the cycle is repeated, beginning with setting input and output counters i and j to 0.

FIG. 9 and FIG. 10 illustrate embodiments of the present invention wherein a number of components represented in FIG. 7 are integrated into a Control Unit/Data Logger means. The Control Unit/Data Logger comprises the computer, switching relay controller and switching relay panels of FIG. 5. Control Unit/Data Logger are commercially available both from manufacturers of distributed control systems (DCS), programmable logic controller (PLC) and data acquisition and control systems (DACS). Manufacturers of suitable Control Unit/Data Loggers include Honeywell, Emerson Electric, General Electric, Allen Bradley, Siemans, Action Instruments, etc. The computer instructions to read and record measured data sets are commensurate with the particular operating system and programming of the Control Unit/Data Logger.

FIG. 9 and FIG. 10 illustrate the use of input current measuring means $I_1$ and output current measuring means $I_2$. Measured pairs are utilized in a similar fashion as in other embodiments of the invention. For each input switching unit position, $I_1$ and $I_2$ are recorded at each output switching unit position.

Both FIG. 9 and FIG. 10 illustrate the same embodiment of the invention. In FIG. 9 the Cable Under Test has opposite ends of conductors connected to input switching unit contacts and output switching unit contacts. This allows integrity of each conductor to be verified when the input and output contacts are connected to the same conductor. In contrast, FIG. 10 connects one end of a conductor to both the has input switching unit contacts and output switching unit contacts.

The arrangement of FIG. 10 is advantageous for determining insulation resistances in, for example, long cable lengths can be determined when only a single end of the Cable Under Test is available. For example, if a cable is presently installed in a facility, it may prove impracticable to connect to both ends of the cable.

In FIG. 9 and FIG. 10 the electric power source may comprise DC or AC current source, either grounded or ungrounded. The measuring means are relied upon to limit the current flow during sequences having the input and output contacts connected to the same conductor. In lieu of relying upon the measuring means, a current limiting ballast resistor may be connected in series with either measuring means $I_1$, or $I_2$.

Common to the embodiments of the present invention is the advantage that only the measurements for each switching configuration need to be recorded in real time; determination of the resistances can deferred until after the test has been completed.

Flame Testing for Cable Failure Mode

Figure 11:
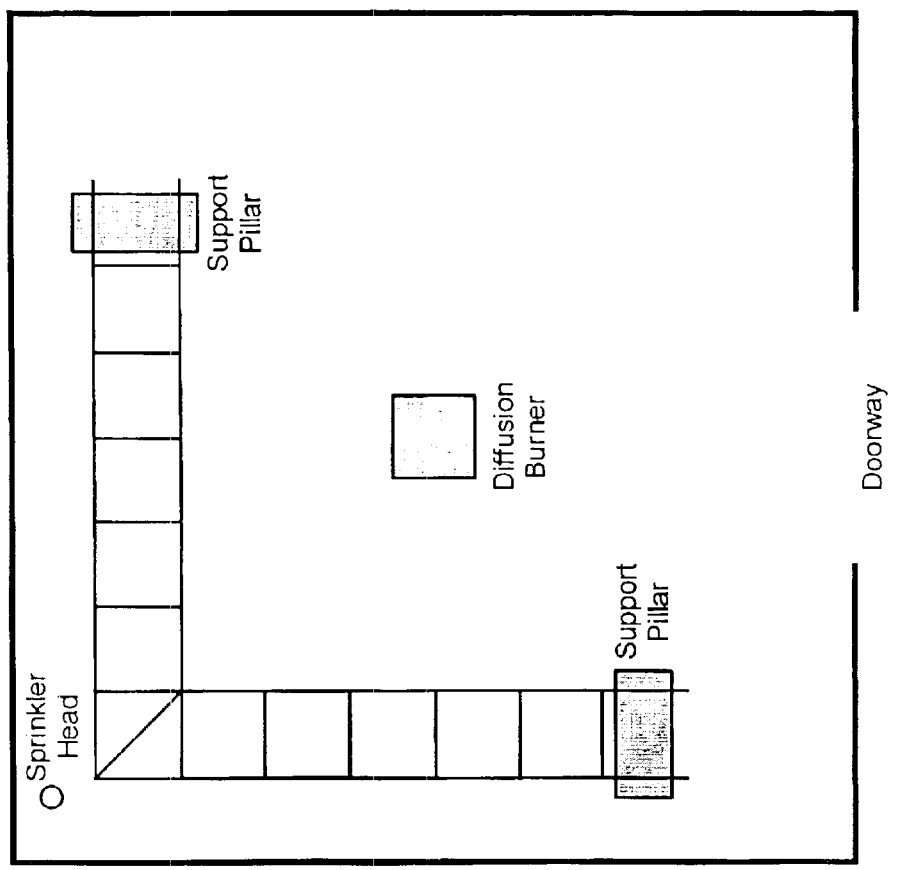
FIG. 11 illustrates a fire testing apparatus.

The apparatus of the present invention can be advantageously utilized in flame testing for cable failure modes. FIG. 11 illustrates the components of a flame testing chamber. Outer containment walls and sealing doorway isolate personnel from flame and toxic gases hazards generated during the test. The Cable Under Test is placed in the supporting cable tray and exposed to plume or hot gas layer flame testing. Diffusion burners are able to produce flame from 70 to 350 kW, based upon flow rate of propane or other combustible fuel consumed.

The use of metal cable tray for supporting the Cable Under Test provides support during the flame test as well as a ground plane reference. In addition, the corner of the support simulates real life conditions experienced by installed cables. As a cable is forced around a corner, additional stresses are imparted to the cable as well as greater likelihood of inter-conductor shorting occurring in the region of the corner.

The flame test chamber of FIG. 11 is also equipped with flame suppression means (for example, fire sprinkler). Flame suppression can also be used to cool the chamber subsequent to use.

EXAMPLES

Figure 1:
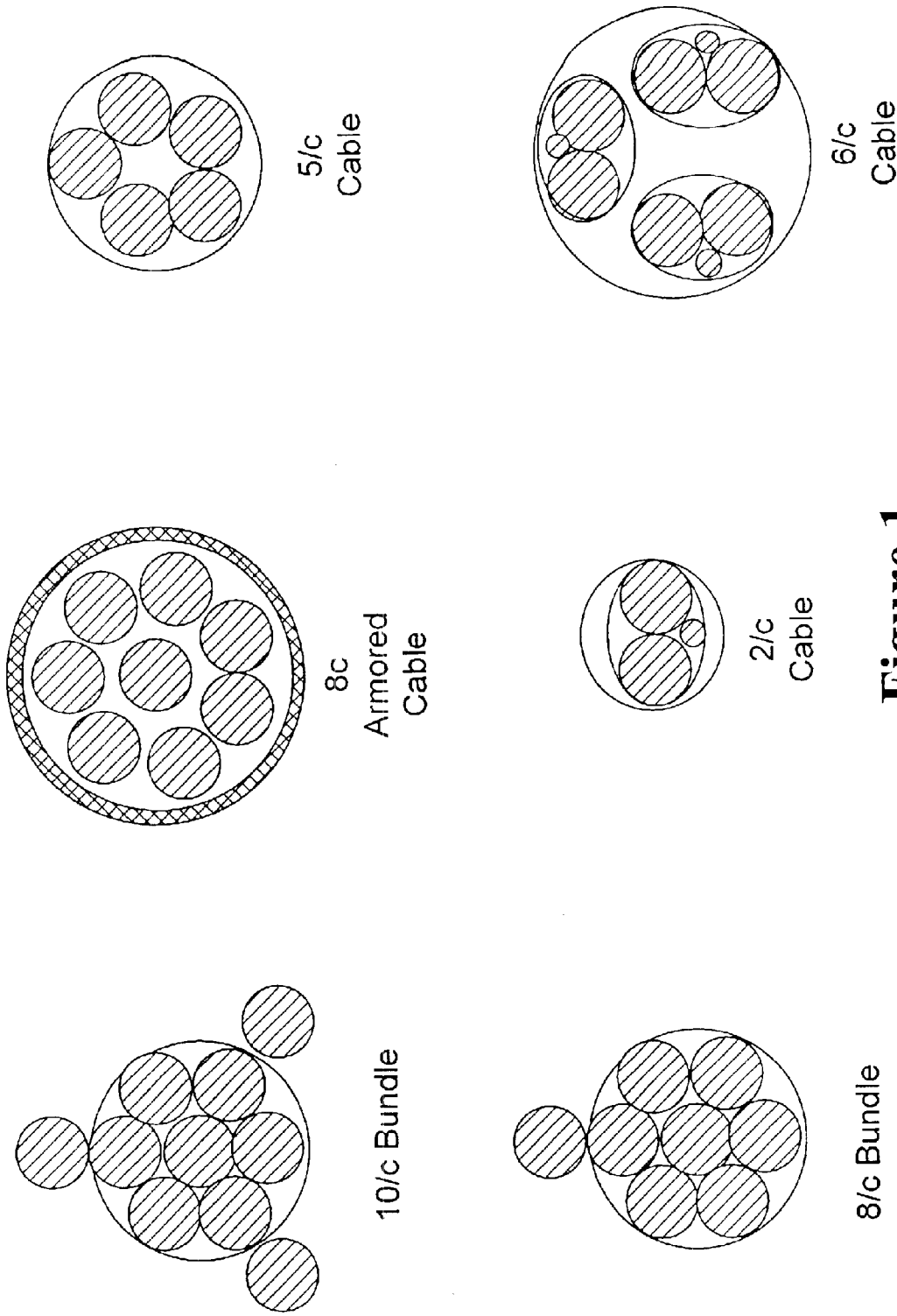
FIG. 1 illustrates examples of common multi-conductor cable types.
Figure 2A:
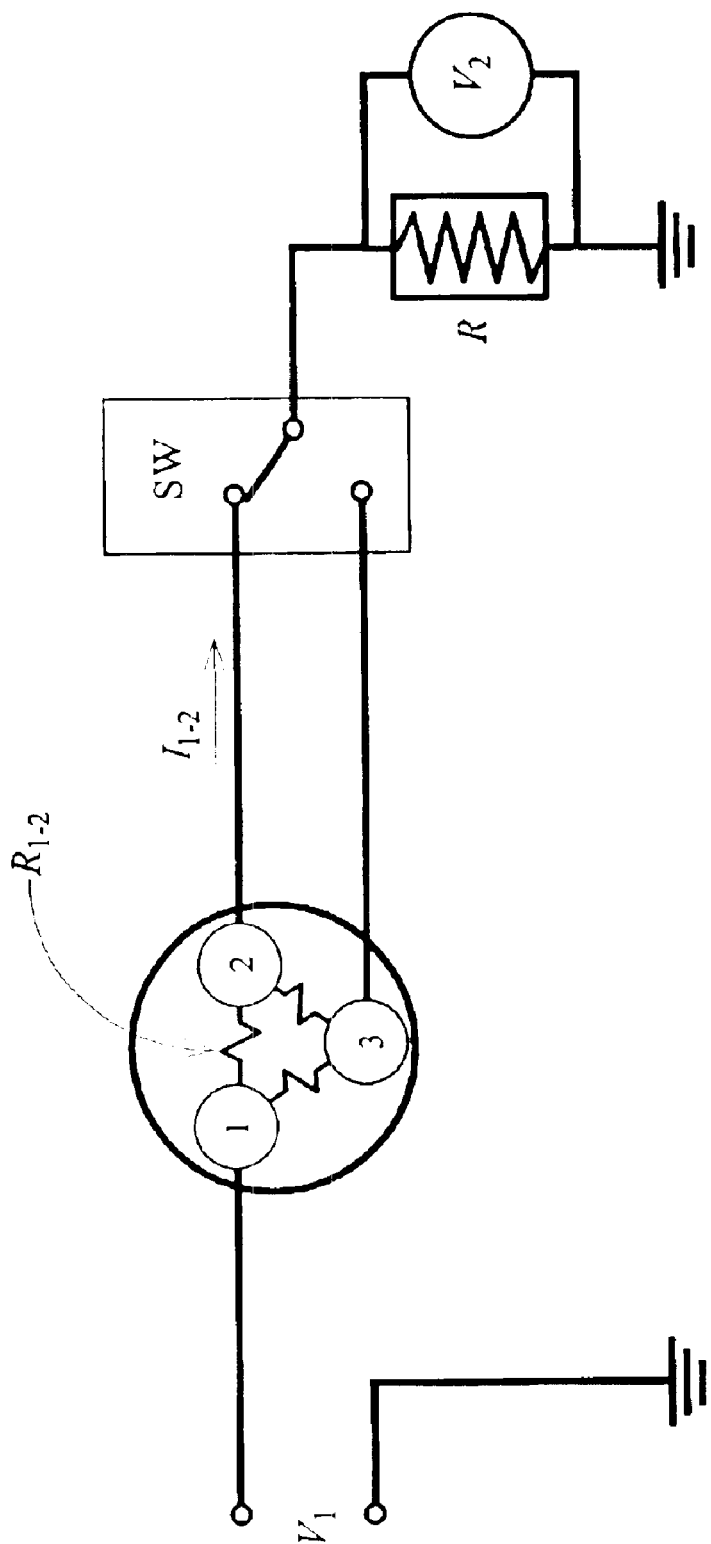
FIG. 2A illustrates insulation resistance testing apparatus for 3 conductor cable, SW connecting to conductor 2.
Figure 2B:
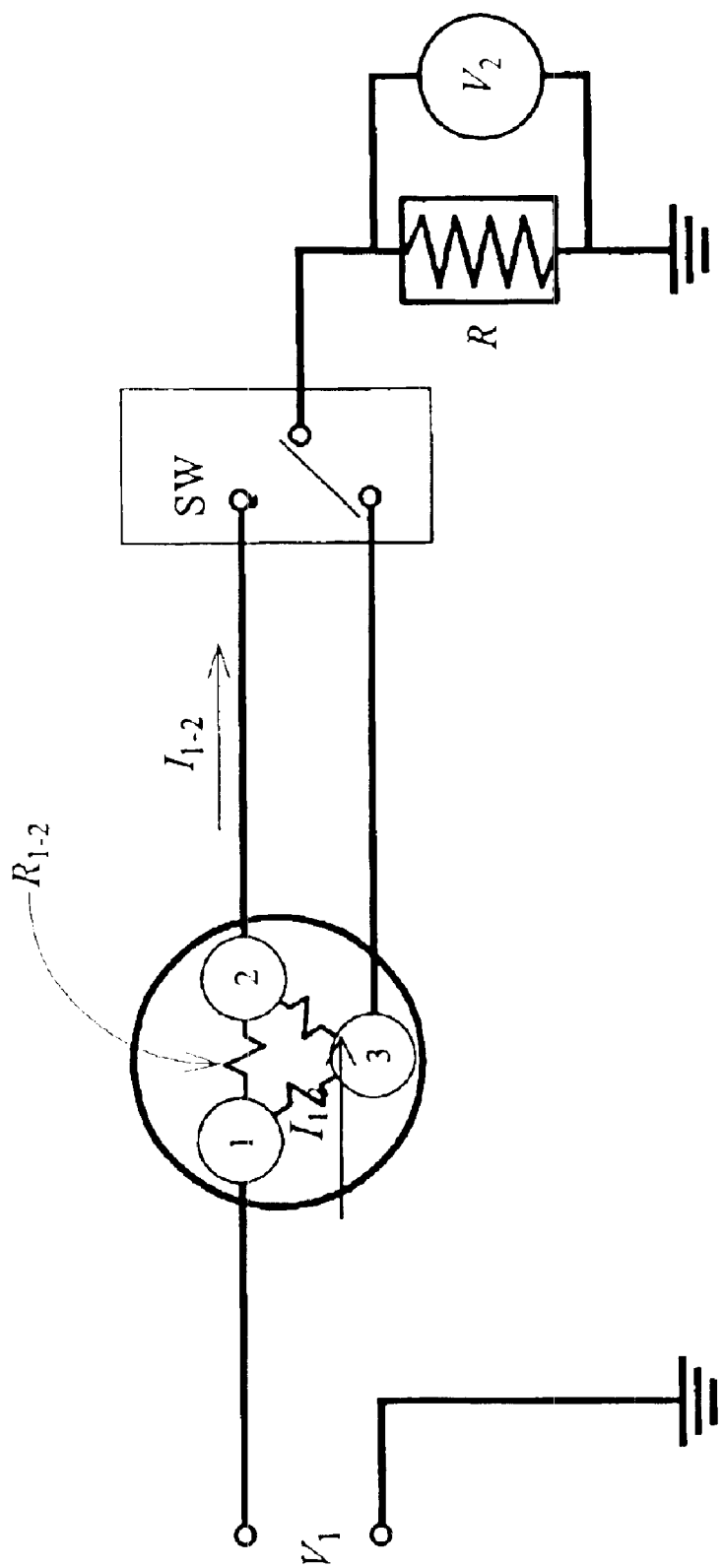
FIG. 2B illustrates insulation:resistance testing apparatus for 3 conductor cable, SW connecting to conductor 3.
Figure 3:
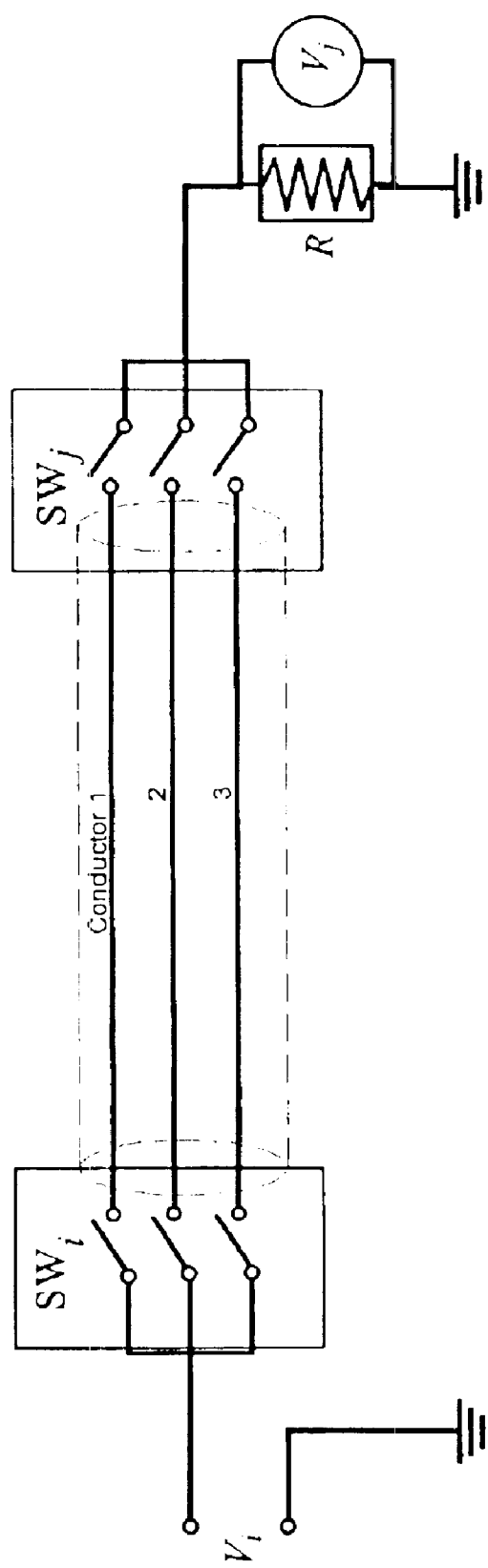
FIG. 3 illustrates insulation resistance testing apparatus for 3 conductor cable, upstream switch $SW_i$, downstream switch $SW_j$.

Examples of application of the present invention are illustrated below. The invention is illustrated, but not to be construed as limited by the following examples:

The embodiment of the present invention as illustrated in FIG. 7 was utilized to measure insulation resistance for each of the cables illustrated in FIG. 1. Table 2 indicates examples of data collected during a test.

TABLE 2

| Time | $SW_i$ | $SW_j$ | $V_1$ | $V_2$ |
|---|---|---|---|---|
| 0.0000 | 1 | 1 | 59.8650 | 60.4120 |
| 1.5440 | 1 | 2 | 3.6612 | 3.8094 |
| 0.5600 | 1 | 3 | 3.8466 | 3.8592 |
| 0.5620 | 1 | 4 | 3.6202 | 3.6267 |
| 0.5620 | 1 | 5 | 3.6528 | 3.6486 |
| 0.5580 | 1 | 6 | 3.8630 | 3.8484 |
| 0.5590 | 1 | 7 | 3.7821 | 3.8484 |
| 0.5630 | 1 | 8 | 3.5555 | 3.5347 |
| 0.5600 | 1 | 9 | 3.8630 | 3.8700 |
| 0.5660 | 1 | 10 | 3.5663 | 3.5564 |
| 0.5870 | 2 | 1 | 3.6312 | 3.7401 |
| 1.5430 | 2 | 2 | 61.0650 | 61.1390 |
| 1.5410 | 2 | 3 | 3.7271 | 3.7753 |
| 0.5610 | 2 | 4 | 3.6096 | 3.5562 |
| 0.5620 | 2 | 5 | 3.7823 | 3.7507 |
| 0.5620 | 2 | 6 | 3.5881 | 3.6373 |
| 0.5600 | 2 | 7 | 3.5393 | 3.5239 |
| 0.5600 | 2 | 8 | 3.7875 | 3.6215 |
| 0.5620 | 2 | 9 | 3.7553 | 3.8754 |
| 0.5600 | 2 | 10 | 3.6310 | 3.6159 |
| 0.5840 | 3 | 1 | 3.5665 | 3.5510 |
| 0.5600 | 3 | 2 | 3.7931 | 3.8373 |
| 1.5430 | 3 | 3 | 60.9750 | 61.7160 |
| 1.5450 | 3 | 4 | 3.6900 | 3.6815 |

Flame Test Examples

Figure 12:
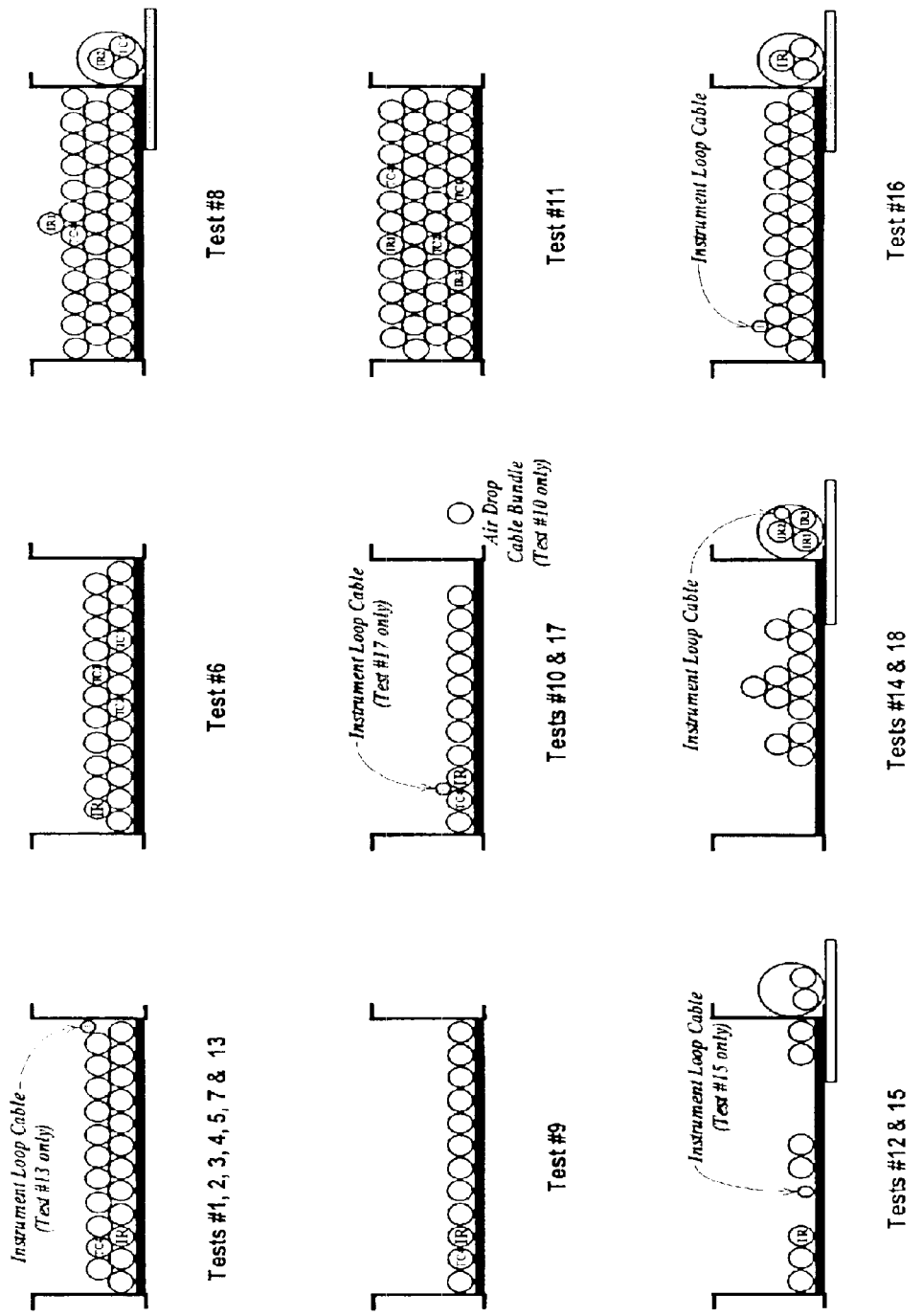
FIG. 12 illustrates various cables tested with the present invention with simultaneous fire testing.

The apparatus of FIG. 7 was next used to conduct insulation resistance testing during flame testing performed in the flame testing apparatus of FIG. 11. The parameters of the tests were selected in order to help explore certain factors that might influence cable failure modes during a fire. For that reason, three flame intensities, two exposure modes (plume and hot layer), a variety of cable tray loading conditions, and several available cable types were included in these tests. Configuration of the various flame tests are as below and illustrated in FIG. 12:

Test #1:

| | |
|---|---|
| Cable Tested: | Armored 8 conductor control cable with the armor shields grounded. The IR System cable shield was not grounded but was monitored as a separate conductor. The conductors were insulated with XLPE and the outer jacket was PVC. |
| Tray Configuration: | Horizontal, 6' above floor, 2-rows of fill. |
| Test Conditions: | 350 kW heat release rate (HRR), plume exposure; 60-minute run followed by 1-minute of water spray. |

Test #2:

| | |
|---|---|
| Cable Tested: | A 7 conductor thermo set control cable with three 1 conductor thermo set cables attached. The conductors in the multi-conductor cable were insulated with XLPE and contained within a Neoprene jacket. The single-conductor cables were insulated with EPR and each had a Hypalon jacket. |
| Tray Configuration: | Horizontal, 5' above floor, 2-rows of fill. |
| Test Conditions: | 70 kW HRR, plume exposure; 60-minute run followed by 1-minute of water spray. |

Test #3:

| | |
|---|---|
| Cable Tested: | A 7 conductor thermo set control cable with three 1 conductor thermo set cables attached. The cable materials used for this test were the same as those used in Test #2. |
| Tray Configuration: | Horizontal, 6' above floor, 2-rows of fill. |
| Test Conditions: | 145 kW HRR, plume exposure; 75-minute run followed by 1-minute of water spray. (The test was allowed to run an additional 15 minutes beyond the planned 60 minutes.) |

Test #4:

| | |
|---|---|
| Cable Tested: | A 7 conductor thermoplastic control cable with three 1 conductor thermoplastic cables attached. The multi conductor cable was insulated and jacketed with Tefzel, the single conductor cables were also insulated with Tefzel but did not have a jacket. Thermo set 5 conductor cable was used as tray fill. |
| Tray Configuration: | Horizontal, 6' above floor, 2-rows of fill. |
| Test Conditions: | 145 kW HRR, plume exposure; ~40-minute run with no water spray (The test was terminated early because all fuses were blown and the IR system showed total shorting to ground.) |

Test #5:

| | |
|---|---|
| Cable Tested: | A 7 conductor thermo set control cable with three 1 conductor thermo set cables attached. All the cables were insulated with EPR and had a Hypalon outer jacket. |
| Tray Configuration: | Horizontal, 7' above floor, 2-rows of fill. |
| Test Conditions: | 200 kW HRR, hot gas layer exposure; ~75-minute run followed by 1-minute of water spray. (The test was extended by 15-minutes because there were indications that device actuations/blown fuses may have been about to occur in the NEI MOV control circuits.) |

Test #6:

| | |
|---|---|
| Cable Tested: | A 7 conductor thermoplastic control cable with three 1 conductor thermoplastic cables attached. The cable materials used for this test were the same as those used in Test #4. Again, thermo set cable was used as tray fill. |
| Tray Configuration: | Horizontal, 7' above floor, 2-rows of fill. |
| Test Conditions: | 200 kW HRR, hot gas layer exposure; ~45-minute run followed by no water spray. (The test was terminated after all fuses had blown and the IR system showed total shorting to ground.) |

Test #7:

| | |
|---|---|
| Cable Tested: | A 7 conductor thermo set control cable with three 1 conductor thermo set cables attached. The types of cables tested were the same as those used in Test #5. |
| Tray Configuration: | Horizontal, 7' above floor, 2-rows of fill. |
| Test Conditions: | 350 kW HRR, plume exposure; ~66-minute run followed by 1-minute of water spray. |

Test #8:

| | |
|---|---|
| Cable Tested: | Two 5 conductor thermo set cables (identified as fire retardant EP) without external conductors attached, one cable was routed in the tray and the other in the conduit. |
| Tray Configuration: | Horizontal, 6' above floor, 3-rows of fill; a conduit with one MOV control circuit cable and one of the 5 conductor IR cables was installed along the inside edges (toward the center of the test cell) of the tray. The conduit also had a ~90-degree bend. |
| Test Conditions: | 145 kW HRR, plume exposure; 93-minute run followed by 1-minute of water spray. |

Test #9:

| | |
|---|---|
| Cable Tested: | A 7 conductor thermo set control cable (same type as used in test #5) with three 1 conductor thermo set cables attached. |
| Tray Configuration: | Horizontal, 6' above floor, 1-row of fill. |

Test #9:

| | |
|---|---|
| Test Conditions: | 145 kW HRR, plume exposure; ~60-minute run followed by 1-min of water spray. The IR system was configured for ungrounded 100 VDC operation. |

Test #10:

| | |
|---|---|
| Cable Tested: | A 7 conductor thermo set control cable (same type as used in test #5) with three 1 conductor thermo set cables attached. The IR bundle only had one 1 conductor external cable attached. |
| Tray Configuration: | Vertical, 1-row of fill, one actuating device bundle was located next to the tray to simulate an air drop. |
| Test Conditions: | 200 kW HRR, hot gas/radiant exposure; ~90-minute run followed by two 1-minute operations of the water spray. The IR system was configured for ungrounded 100 VDC operation. |

Test #11:

| | |
|---|---|
| Cable Tested: | Two instrument cables without external conductors attached, one was a 2 conductor and one was a 6 conductor. |
| Tray Configuration: | Horizontal. 6' above floor, 4-rows of fill. |
| Test Conditions: | 145 kW HRR, plume exposure; ~75-minute run followed by 1-min of water spray. The IR system was configured for ungrounded 24 VDC operation. |

Test #12:

| | |
|---|---|
| Cable Tested: | A 7 conductor thermo set (EPR/Hypalon) control cable with three 1 conductor thermo set (same type as used in Test #2) cables attached. |
| Tray Configuration: | Horizontal, 6' above floor, 1-row of fill. |
| Test Conditions: | 145 kW HRR, plume exposure; ~60-minute run followed by no water spray. The IR system was configured for grounded 100 VDC operation. |

Test #13:

| | |
|---|---|
| Cable Tested: | For the IR system: An armored 8 conductor control cable (same as used in test #1) without external cables attached. The armor shield was grounded.<br>For the Instrument Loop circuit:<br>A shielded 2 conductor thermo set (EPR/Hypalon) instrumentation cable. |
| Tray Configuration: | Horizontal, 7' above floor, 2-rows of fill. |
| Test Conditions: | 350 kW HRR, hot gas layer exposure; ~38-minute run. The IR system was configured for 120 VAC operation. |

Test #14:

| | |
|---|---|
| Cable Tested: | For the IR system: Three 3 conductor thermo set control cables grouped into a single bundle and routed in the conduit.<br>For the Instrument Loop circuit: A thermoplastic (PE/PVC) 2 conductor instrument cable routed in the cable tray. |
| Tray Configuration: | Horizontal, 6' above floor, 2-rows of fill in the tray; a conduit with the IR cable bundle was mounted along the inside edge (toward the center of the test cell) of the tray.<br>The conduit also had a 90-degree bend and was grounded. |
| Test Conditions: | 145 kW HRR, plume exposure; ~2½-hour run followed by 2-minutes of water spray. The IR system was configured for 120 VAC operation. |

Test #15:

| | |
|---|---|
| Cable Tested: | For the IR system: A 7 conductor thermo set control cable with three 1 conductor thermo set cables attached.<br>The same type of cables as used in Test #12.<br>For the Instrument Loop circuit: A 2 conductor thermo set instrument cable with shield and drain wire. |
| Tray Configuration: | Horizontal, 6' above floor, 1-row of fill. |
| Test Conditions: | Variable HRR (350/200/450 kW), hot gas layer exposure; ~50-minute run followed by 1-minute of water spray. The IR system was configured for 120 VAC operation. |

Test #16:

| | |
|---|---|
| Cable Tested: | For the IR system: A 9 conductor thermoplastic control cable with three 1 conductor thermoplastic cables attached. These cables had PE insulation and a PVC jacket.<br>For the Instrument Loop circuit: A three-pair thermoplastic (PVC/PVC) instrument cable with shield and drain wire. |
| Tray Configuration: | The IR cable bundle was located in the horizontal conduit at 6' above the floor. The instrument cable was located in the horizontal tray at 6' above the floor with 2-rows of fill. |
| Test Conditions: | 145 kW HRR, plume exposure; ~30-minute run. The IR system was configured for 120 VAC operation. |

Test #17:

| | |
|---|---|
| Cable Tested: | For the IR system: A 9 conductor thermoplastic control cable with three 1 conductor thermoplastic cables attached. These are the same type of cables as used in Test #16.<br>For the Instrument Loop circuit: A 2 conductor thermo set (EPDM/Hypalon) instrument cable. |
| Tray Configuration: | Vertical, 1-row of fill. |
| Test Conditions: | 200 kW HRR, hot gas/radiant exposure; ~60-minute run followed by 1-minute of water spray. The IR system was configured for ungrounded 120 VAC operation. |

| Test #18: | |
|---|---|
| Cable Tested: | For the IR system: Three 3 conductor thermo set control cables grouped into a single bundle and routed in the conduit. These are the same type of cables as used in Test #14.<br>For the Instrument Loop circuit: A thermo set (EPR/Hypalon) 2 conductor instrument cable routed in the cable tray. |
| Tray Configuration: | Horizontal, 7' above floor, 2-rows of fill in the tray; a conduit with the IR cable bundle was mounted along the inside edge (toward the center of the test cell) of the tray.<br>The conduit also had a 90-degree bend and was grounded. |
| Test Conditions: | 250 kW HRR, hot gas layer exposure; ~2-hour run followed by 2-minutes of water spray. The IR system was configured for 120 VAC operation. |

Results of cable failure mode flame tests using the present invention are given in Table 3. In the summary results of Table 3, cable failure is defined as a drop in conductor-to-conductor or conductor-to-ground insulation resistance to 100 ohms or less.

12 saw an initial short to ground whereas all of the other tray tests saw conductor-to-conductor hot shorts. Overall, the tests do indicate that the likelihood of an initial failure involving conductor-to-conductor hot shorts within a multi-conductor cable is relatively high for multi-conductor cables in a ladder-back cable tray.

In contrast, for tests involving the failure of cables in conduits (Tests 8 and 18), the initial failures all involved conductor-to-ground short circuits (to the grounded conduit). In Test 8 the conductors of a single 5/C cable were monitored, and each conductor showed initial failures involving shorts to ground. In Test 18, three-3/C cables were monitored, and the first failure for each of the nine conductors in this test was a short-to-ground. This appears to indicate a relatively lower likelihood of either intra- or inter-cable conductor-to-conductor hot shorts for cables in conduits. These results indicate a pronounced difference in the relative likelihood of shorts-to-ground versus conductor-to-conductor shorts between cable trays and conduits.

While the present invention has been described in the context of preferred embodiments, it will be readily apparent to those skilled in the art that other modifications and variations can be made without departing from the spirit or scope of the present invention. For example, measuring

TABLE 3

Summary of Cable Failures in Flame Tests

| Test # | Test Conditions | Intra-Cable Failure; Conductor-ground | Intra-Cable Failure; Conductor-conductor | Inter-Cable Failure; Conductor-ground | Inter-Cable Failure; Conductor-conductor |
|---|---|---|---|---|---|
| 3 | bundles with 1-7/C and 3-1/C thermo-set cables, in a cable tray, 2-rows of fill, cable in lower row of fill (in contact with tray rungs), plume exposure | — | 1/1 | 2/3 | 1/3 |
| 4 | same as Test 3 but with thermo-plastic cables | — | 1/1 | 1/3 | 2/3 |
| 6 | similar to Test 4 but hot layer exposure and 7/C cable on the upper layer of fill (not in contact with tray rungs), plume exposure | — | 1/1 | 2/3 | 1/3 |
| 7 | similar to Test 3 but using different cable and a larger fire (350 kW) | — | 1/1 | 3/3 | — |
| 8 | 1-5/C thermo-set cable in a conduit with two other cables | 1/1 | — | n/a | n/a |
| 12 | bundle and conditions similar to Test 3 but only a single row of tray fill | 1/1 | — | 1/1 | — |
| 18 | bundle of 3-3/C thermo-set cables placed in a grounded conduit, plume exposure | 3/3 | — | 3/3 | — |

Table 3 notes:
(1) Test 8 also had a 5/C cable monitored for insulation resistance in the tray but this second cable did not fail;
(2) In Test 12, three 1/C cables were ganged together as a single conductor circuit for the insulation resistance system.

The insulation resistance results illustrated a range of shorting behaviors. For the multi-conductor cables in a tray, 4 of the 5 failures observed (Tests 3, 4, 6, and 7) involved initial conductor-to-conductor short circuits. Test 12 involved a short-to-ground as the initial fault mode for the multi-conductor cable. There are no clear indications that any particular test condition contributed to the fact that Test means can incorporate both voltage and current measurement The type of cable and number of conductors in a cable to be tested can vary. Additionally, the components of the invention can be incorporated into a single integrated mechanical package. Accordingly, it is not intended that the present invention be limited to the specifics of the foregoing description of preferred embodiments, but rather as being limited only by the scope of the invention as defined in the following claims.

What is claimed is:

1. An apparatus for automatically measuring and recording insulation resistances of a multi-conductor cable comprising:
   power supply source;
   input measuring means;
   output measuring means;
   input relay controlled contacts;
   output relay controlled contacts;
   relay controller; and
   computer,
   wherein the computer transmits instructions to the relay controller to set the position of input relay controlled contacts and output relay controlled contacts;
   wherein the computer receives digital messages from the input measuring means;
   wherein the computer receives digital messages from the output measuring means;
   wherein the digital messages received from the input measuring means and output measuring means comprise values of measured variables;
   wherein the computer records an input measured variable value and an output measured variable value for each combination of input relay controlled contact position and output relay controlled contact position;
   and wherein the computer determines insulation resistance values from the recorded values of measured variables.

2. The apparatus of the claim 1 wherein the input relay controlled contacts comprise 10 or more contacts and the output relay controlled contacts comprise 10 or more contacts.

3. The apparatus of claim 1 wherein the input measuring means consists of a voltage measuring means comprising computer interface connection and the output measuring means consists of a voltage measuring means comprising computer interface connection.

4. The apparatus of claim 3 wherein computer interface connections are in accordance with IEEE specification 488 for computer communication interfaces.

5. The apparatus of claim 1 wherein the relay controller means comprises a programmable logic controller further comprising controller instructions for selectively closing contacts of the input relay controlled contacts and the output relay controlled contacts in accordance with instructions received from the computer.

6. The apparatus of claim 1 wherein the relay controller means comprises a distributed control system further comprising controller instructions for selectively closing contacts of the input relay controlled contacts and the output relay controlled contacts in accordance with instructions received from the computer.

7. The apparatus of claim 1 wherein a measured pair of input measured variable value and an output measured variable value is recorded for each combination of 2 conductors of the multi-conductor cable.

8. The apparatus of claim 7 wherein the input measured variable is a voltage value and the output measured variable is a voltage value.

9. The apparatus of claim 1 wherein the multi-conductor cable comprises ganged single insulated conductors.

10. The apparatus of claim 1 further comprising a fire test chamber.

11. An apparatus for automatically measuring and recording insulation resistances of a multi-conductor cable comprising:
    power supply source;
    input measuring means;
    output measuring means;
    input switching unit;
    output switching unit; and
    control unit/data logger,
    wherein the control unit/data logger transmits instructions to set the position of input switching unit contacts and transmits instructions to set the position of output switching unit contacts;
    wherein the control unit/data logger receives digital messages from the input measuring means:
    wherein the control unit/data logger receives digital messages from the output measuring means;
    wherein the digital messages received from the input measuring means and output measuring means comprise values of measured variables;
    wherein the control unit/data logger records an input measured variable value and an output measured variable value for each combination of input switching unit contact position and output switching unit contact position; and wherein the control unit/data logger determines insulation resistance values from the recorded values of measured variables.

12. The apparatus of claim 11 wherein the input switching unit contacts comprise 10 or more contacts and the output switching unit contacts comprise 10 or more contacts.

13. The apparatus of claim 11 wherein the input measuring means consists of a current measuring means comprising control unit/data logger interface connection and the output measuring means consists of a current measuring means comprising control unit/data logger interface connection.

14. The apparatus of claim 11 wherein the control unit/data logger, the input switching unit and the output switching unit are integrated into a single programmable logic controller device.

15. The apparatus of claim 11 wherein the control unit/data logger, the input switching unit and the output switching unit are integrated into a single distributed control system device.

16. The apparatus of claim 11 wherein the control unit/data logger, the input switching unit and the output switching unit are integrated into a single data acquisition and control system device.

17. The apparatus of claim 11 wherein a measured pair of input measured variable value and an output measured variable value is recorded for each combination of 2 conductors of the multi-conductor cable.

18. The apparatus of claim 17 wherein the input measured variable is a current value and the output measured variable is a current value.

19. The apparatus of claim 11 wherein the mult-conductor cable comprises ganged single insulated conductors.

20. The apparatus of claim 11 further comprising a fire test chamber.

21. A method of automatically determining insulation resistances of a multi-conductor cable, the method comprising the steps of:
    connecting a multi-conductor cable to a power source;
    automatically connecting an input voltage of higher value to one conductor of the multi-conductor cable;
    automatically connecting an output voltage of lower value, in turn to each remaining conductor of the mult-conductor cable;
    automatically measuring and recording an input measured variable and an output measured variable for each combination of automatic connecting to an input voltage and connecting to an output voltage; and determining multi-conductor insulation resistances from the recorded values of input measured variable and output measured variable.

22. The method of claim 21 wherein the input measured variable and output measured variables comprise voltages measurements determined from electrical connections across ballast resistors of known values.

23. The method of claim 21 wherein measured pairs of an input measured variable value and an output measured variable value is recorded for each combination of 2 conductors of the multi-conductor cable.

24. The method of claim 21 wherein automatically measuring and recording of an input measured variable and an output measured variable occur while the multi-conductor cable is exposed to a fire test.

* * * * *